(12) United States Patent
Shih

(10) Patent No.: US 6,747,325 B2
(45) Date of Patent: Jun. 8, 2004

(54) LDD STRUCTURE OF THIN FILM TRANSISTOR AND PROCESS FOR PRODUCING SAME

(75) Inventor: An Shih, Changhua (TW)

(73) Assignee: Toppoly Optoelectronics Corp., Miao-Li (TW)

( * ) Notice: Subject to any disclaimer, the term of this patent is extended or adjusted under 35 U.S.C. 154(b) by 0 days.

(21) Appl. No.: 10/263,077

(22) Filed: Oct. 2, 2002

(65) Prior Publication Data

US 2004/0065924 A1 Apr. 8, 2004

(30) Foreign Application Priority Data

Jul. 8, 2002 (TW) ........................................ 91115101 A

(51) Int. Cl.[7] .............................................. H01L 29/76
(52) U.S. Cl. ........................ 257/408; 257/347; 257/344
(58) Field of Search ................................. 257/408, 347, 257/344

(56) References Cited

U.S. PATENT DOCUMENTS

| | | | | |
|---|---|---|---|---|
| 4,258,465 A | * | 3/1981 | Yasui et al. ................... 29/571 |
| 4,697,333 A | * | 10/1987 | Nakahara ...................... 437/20 |
| 4,949,136 A | * | 8/1990 | Jain ........................... 357/23.3 |
| 5,217,910 A | * | 6/1993 | Shimizu et al. ................ 437/35 |
| 5,936,278 A | * | 8/1999 | Hu et al. ..................... 257/336 |
| 6,071,762 A | | 6/2000 | Wu et al. |
| 6,165,876 A | | 12/2000 | Yamazaki et al. |
| 6,211,533 B1 | | 4/2001 | Byun et al. |
| 6,281,552 B1 | | 8/2001 | Kawasaki et al. |
| 6,284,577 B1 | | 9/2001 | Suzawa et al. |

* cited by examiner

Primary Examiner—Mark V. Prenty
(74) Attorney, Agent, or Firm—Volpe and Koenig, P.C.

(57) ABSTRACT

A thin film transistor having a single LDD structure is provided. The single LDD structure is disposed between source/drain structures, and having a first side adjacent to a first one of the source/drain structures and a second side spaced from a second one of the source/drain structures by essentially a semiconductor material. Another thin film transistor having a first kind of LDD and a second kind of LDD structure is also provided. The second kind of LDD structure is adjacent to the first kind of LDD structure. The process for manufacturing such thin film transistor is also disclosed.

5 Claims, 12 Drawing Sheets

LDD STRUCTURE OF THIN FILM TRANSISTOR AND PROCESS FOR PRODUCING SAME

FIELD OF THE INVENTION

The present invention relates to a thin film transistor, and more particularly to a lightly doped drain (LDD) structure of the thin film transistor. The present invention also relates to a process for producing such an LDD structure of a thin film transistor.

BACKGROUND OF THE INVENTION

With the increasing development of integrated circuits, electronic devices have a tendency toward miniaturization. As is known, TFTs (Thin Film Transistors) are widely used as basic elements for controlling pixels of a TFT liquid crystal display (TFT-LCD). As a result of miniaturization, a channel between a source region and a drain region in each TFT unit will become narrower and narrower. Therefore, a short channel effect is likely to occur. Such short channel effect possibly causes the TFT unit to be undesirably turned on even when the gate voltage is zero. The switch function of the transistor is thus failed. In addition, the electric field intensity at the channel increases due to the short distance. Therefore, hot electrons in the vicinity of the drain region have a higher energy compared with the energy gap of the semiconductor. The electrons in valence bands might be promoted to conduction bands when being collided by the hot electrons, thereby producing many electron-hole pairs. Such phenomenon is also referred as a "hot electron effect".

In a TFT-LCD, the TFT units are typically formed on a glass substrate. Since the glass substrate is generally not heat resistant, the process for producing TFTs on the LCD glass plate should be a low-temperature manufacturing process. In order to minimize the hot electron effect, a low-temperature polysilicon thin film transistor (LTPS-TFT) having LDD (lightly doped drain) structures was developed. In these LTPS-TFTs, a gate-drain overlapped LDD (GO-LD) structure was widely employed.

A process for producing such an N-type LTPS-TFT is illustrated with reference to FIGS. 1(a) to 1(g). In FIG. 1(a), a silicon-oxide buffer layer 11 and an intrinsic amorphous silicon (i-a-Si) layer are sequentially formed on a glass substrate 10. Then, the i-a-Si layer is converted to an intrinsic polysilcon (i-poly-Si) layer 12 by a laser annealing procedure. Then, by a micro-photolithography and etching procedure, the i-poly-Si layer 12 is partially etched to form a desired polysilicon structure 120, as can be seen in FIG. 1(b). In FIG. 1(c), a photoresist layer is formed on the polysilicon structure 120 and properly patterned to be a mask 13. Then, two N-type regions 121 and 122 are formed on a portion of the polysilicon structure 12 exposed from the mask 13 by an ion implantation procedure. The two N-type regions 121 and 122 serve as source/drain regions of an N-channel TFT. After the photoresist mask 13 is removed, a gate insulator 14, for example made of silicon dioxide, is formed on the resulting structure of FIG. 1(c), as shown in FIG. 1(d). In FIG. 1(e), a gate electrode 15 is then formed on the gate insulator 14 by sputtering and patterning a gate conductive layer on the resulting structure of FIG. 1(d). Then, by a lightly ion implantation procedure with the gate electrode 15 serving as a mask to provide trace N-type dopants into the polysilicon structure 120, two LDD (lightly doped drain) regions 123 and 124 are formed immediately adjacent to the drain/source regions 121 and 122, respectively. In FIG. 1(f), an interlayer dielectric layer 17 is formed on the resulting structure of FIG. 1(e). Then, a proper number of contact holes directing to the gate electrode and source/drain regions are created. Afterwards, as shown in FIG. 1(g), a conductive layer is sputtered on the resulting structure of FIG. 1(f), fills the contact holes, and then patterned to form a gate conductive line 190 and a source/drain conductive line 191.

The gate-drain overlapped LDD (GO-LD) structure results in a reduced electric field intensity in the vicinity of the drain region so as to slightly diminish the influence of the hot electron effect. However, with the increasing demand of high resolution of the display, the circuitry is more and more complicated than ever. In other words, the number of the electronic devices increases significantly so as to reduce the space of a single electronic device. Accordingly, the channels of transistors will become narrower and narrower. Furthermore, the LDD regions shorten the channel to an extent, and thus depletion regions in the vicinity of the source/drain regions will be relative close and even reachable to each other. Therefore, current leakage and punch-through problems may occur so as to deteriorate the electronic devices. The above-described effects will be even significant with the increasing development toward miniaturization.

SUMMARY OF THE INVENTION

It is an object of the present invention to provide a thin film transistor having diminished hot electron, current leakage and punch-through effects.

It is another object of the present invention to provide a process for producing a thin film transistor having a particular LDD structure to reduce hot electron, current leakage and punch-through effects.

In accordance an aspect of the present invention, there is provided a thin film transistor. The thin film transistor comprises a semiconductor layer, source/drain structures, a single LDD structure, a gate structure and an insulator layer. The semiconductor layer is formed of a semiconductor material such as polycrystalline silicon, and the semiconductor layer is disposed on a glass substrate. The source/drain structures are formed apart from each other in the semiconductor layer. The single LDD structure is disposed between the source/drain structures, and having a first side adjacent to a first one of the source/drain structures and a second side spaced from a second one of the source/drain structures by essentially the semiconductor material. The gate structure is formed over the semiconductor layer. The insulator layer is disposed between the semiconductor layer and the gate electrode for insulating the gate electrode from the source/drain structures and the LDD structure.

In an embodiment, the single LDD structure is a gate-drain overlapped LDD. The first one of the source/drain structures is the drain structure, and the second one of the source/drain structures is the source structure.

In an embodiment, the thin film transistor is of an N-type, and the LDD structure contains a doping material selected from a group consisting of P ions, As ions, $PH_x$ ions, $AsH_x$ ions and a combination thereof.

In accordance with another aspect of the present invention, there is provided a thin film transistor. The thin film transistor comprises a semiconductor layer, source/drain structures, a first LDD structure, a second LDD structure, a gate structure and an insulator layer. The semiconductor layer is formed of a semiconductor material. The source/drain structures is formed apart from each other in the semiconductor layer. The first LDD structure is disposed between the source/drain structures, and having a first side adjacent to a first one of the source/drain structures and a second side opposed to the first side. The second LDD structure having a third side adjacent to the second side of the first LDD structure, and a fourth side spaced from a second one of the source/drain structures by essentially the semiconductor material. The gate structure formed over the semiconductor layer. The insulator layer is disposed between the semiconductor layer and the gate electrode for insulating the gate electrode from the source/drain structures and the LDD structures.

In an embodiment, each of the first and second LDD structures is a gate-drain overlapped LDD. The thin film transistor is of an N-type, the first LDD structure contains a doping material selected from a group consisting of P ions, As ions, $PH_x$ ions, $AsH_x$ ions and a combination thereof, and the second LDD structure contains more than one doping material selected from a group consisting of B ions, $BH_x$ ion, $B_2H_x$ ions and a combination thereof.

In an embodiment, the thin film transistor further comprises a third LDD structure and a fourth LDD structure. The third LDD structure is disposed between the source/drain structures, and having a fifth side adjacent to the second one of the source/drain structures and a sixth side opposed to the fifth side. The fourth LDD structure has a seventh side adjacent to the sixth side of the third LDD structure, and an eighth side spaced from the fourth side of the second LDD structure by essentially the semiconductor material. The third LDD structure contains a doping material selected from a group consisting of P ions, As ions, $PH_x$ ions, $AsH_x$ ions and a combination thereof, and the fourth LDD structure contains more than one doping material selected from a group consisting of B ions, $BH_x$ ion, $B_2H_x$ ions and a combination thereof.

In an embodiment, at least a portion of the first and third LDD structures is exposed from the second and fourth LDD structures and the source/drain structures.

In an embodiment, the first LDD structure is enclosed with the second LDD structure and the first one of the source/drain structures, and the second LDD structure is enclosed with the fourth LDD structure and the second one of the source/drain structures.

In according to another aspect of the present invention, there is provided a process for forming a thin film transistor. A gate insulator layer is formed on a semiconductor layer. Then, a gate structure is formed on the gate insulator layer. Then, source/drain structures are formed in the semiconductor layer, wherein the source/drain structures are spaced from each other by a channel region. Then, a first kind of doping material is injected into a first end portion of the channel region in a first direction of a first angle from a surface of the semiconductor layer to form a first LDD structure, and a second kind of doping material is injected into the first end portion of the channel region in a second direction of a second angle from the surface of the semiconductor layer to form a second LDD structure in contact with the first LDD structure.

In an embodiment, the first kind of doping material is selected from a group consisting of P ions, As ions, $PH_x$ ions, $AsH_x$ ions and a combination thereof, and the second kind of doping material contains at least one member selected from a group consisting of B ions, $BH_x$ ion, $B_2H_x$ ions and a combination thereof.

In an embodiment, the step of injecting the first kind of doping material is performed over the channel region with the gate structure serving as a mask, and a third LDD structure is simultaneously formed in a second end portion of the channel region opposite to the first end portion when the first LDD is formed.

In an embodiment, the process for forming a thin film transistor further comprises a step injecting a third kind of doping material into the second end portion of the channel region in a third direction of a third angle from the surface of the semiconductor layer to form a fourth LDD structure in contact with the second LDD structure.

Preferably, the first angle is substantially 90°, and each of the second angle and the third angle is greater than 0° and no greater than 30°.

Preferably, the third kind of doping material is the same as the third kind of doping material.

In an embodiment, the gate structure includes a gate electrode and a spacer structure beside the gate electrode, and the step of injecting the first doping material is performed after the spacer structure is removed.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For the purpose of preventing from possible contact of the depletion regions in the vicinity of the source/drain regions with each other, an aspect of the present invention provides a TFT with a single LDD structure so that the source/drain depletion regions will not be that close to each other as in the prior art. Two examples of such TFTs and processes for producing the same are illustrated with reference to FIGS. 2(a) to 2(f) and 3(a) to 3(f), respectively.

Figure 1A:
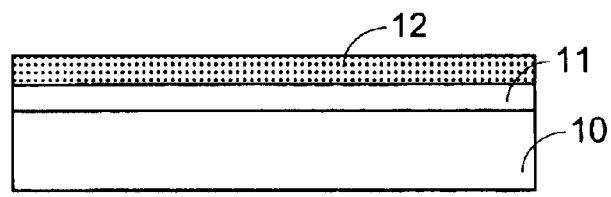
FIGS. 1(a) to 1(g) are schematic cross-sectional views illustrating a conventional process for producing a TFT having LDD structures.
Figure 1B:
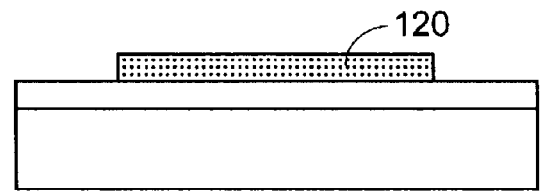
Figure 1C:
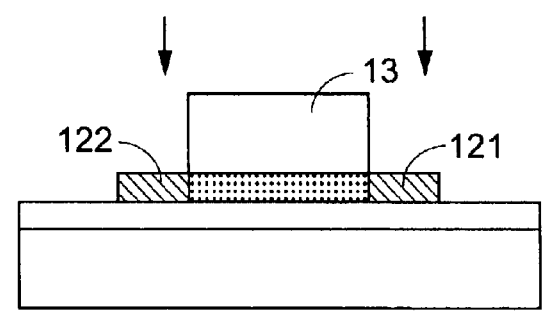
Figure 1D:
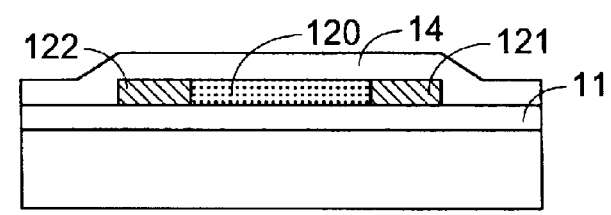
Figure 1E:
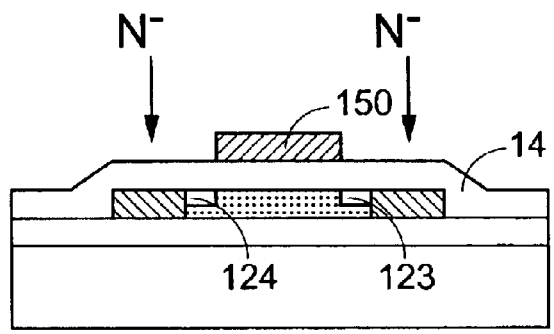
Figure 1F:
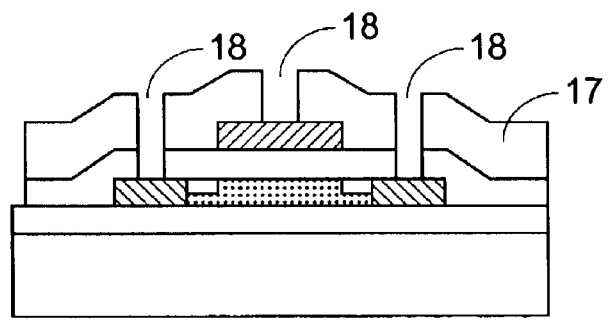
Figure 1G:
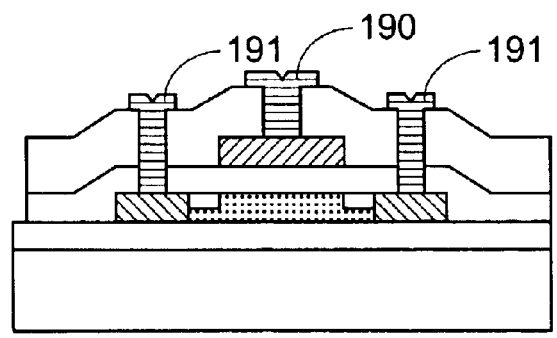
Figure 2A:
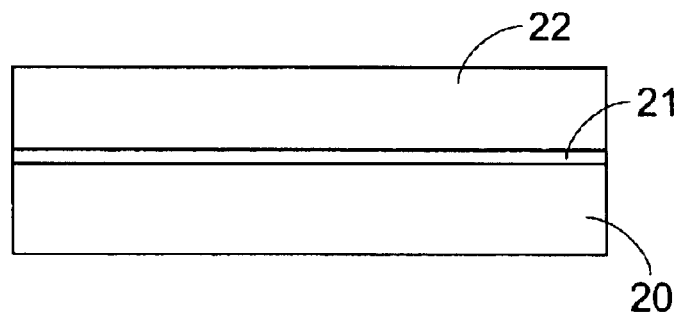
FIGS. 2(a) to 2(f) are schematic cross-sectional views illustrating a process for producing a TFT having a single LDD structure according to an embodiment of the present invention.
Figure 2B:
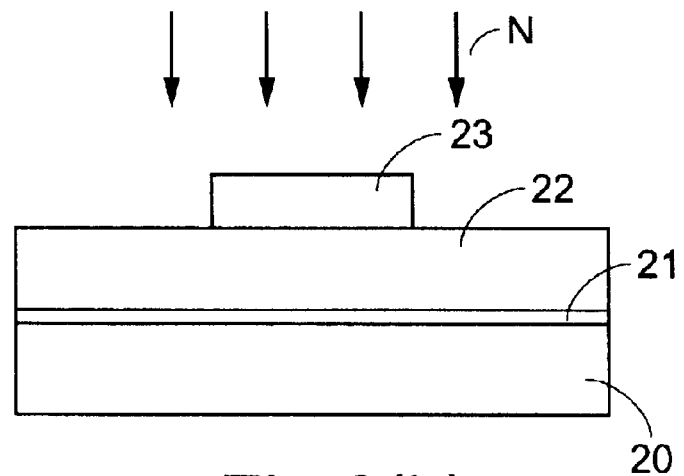
Figure 2C:
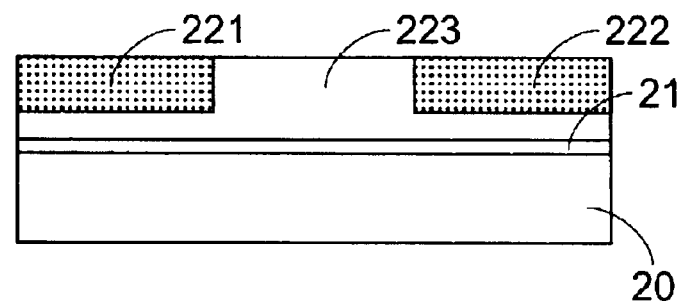
Figure 2D:
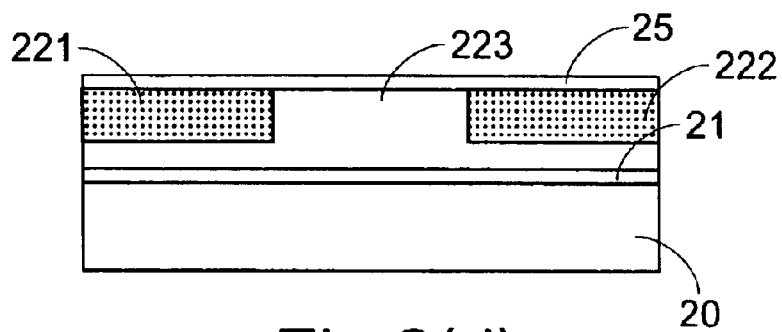
Figure 2E:
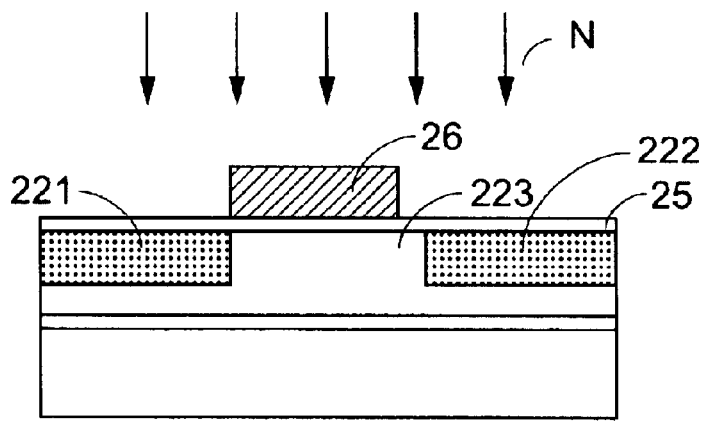
Figure 2F:
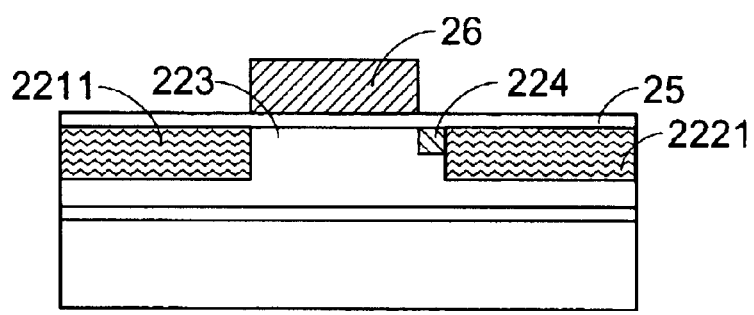

As shown in FIG. 2(a), a buffer layer 21 is formed on a glass substrate 20. An intrinsic amorphous silicon (i-a-Si) layer is subsequently formed on the buffer layer 21, and the i-a-Si layer is further converted to an intrinsic polysilcon (i-poly-Si) layer 22 by a laser annealing procedure. A photoresist layer is then formed on the polysilicon layer 22 and properly patterned to be a mask 23 via a micro-lithographic and etching process, and two N-type regions 221 and 222 are formed in the polysilicon layer 22 exposed from the mask 23 by an N-type ion implantation procedure, as shown in FIGS. 2(b) and 2(c). The two N-type regions 221 and 222 are apart from each other by a channel region 223. Then, the photoresist mask 23 is removed. Referring to FIG. 2(d), a gate insulator 25 is formed on the resulting structure of FIG. 2(c). As shown in FIG. 2(e), a gate electrode 26 having a width slightly less than the length of the channel 223 is then formed on the gate insulator 25 via patterning and etching procedures such that an end portion of the channel region 223 is exposed and uncovered by the gate electrode 26. Then, by a lightly ion implantation procedure with the gate electrode 26 serving as a mask to provide trace N-type dopants into the exposed portion of the polysilicon layer 22, a single LDD structure 224 is formed in the polysilicon layer 22, as can be seen in FIG. 2(f), and the N-type regions 221 and 222 are consequently heavily doped to form the source/drain regions 2211 and 2221. Afterwards, an interlayer dielectric layer, contact holes, gate and source/drain conductive lines and any other required structures are sequentially formed on the resulting structure of FIG. 2(f) to complete the TFT.

Figure 3A:
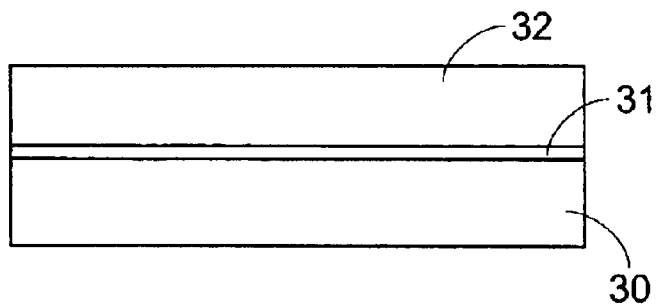
FIGS. 3(a) to 3(f) are schematic cross-sectional views illustrating a process for producing a TFT having a single LDD structure according to another embodiment of the present invention.
Figure 3B:
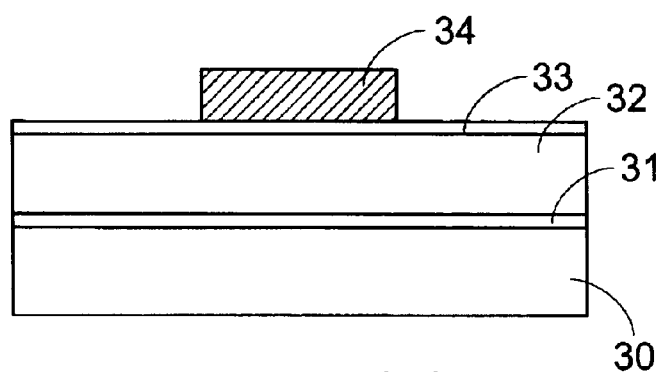
Figure 3C:
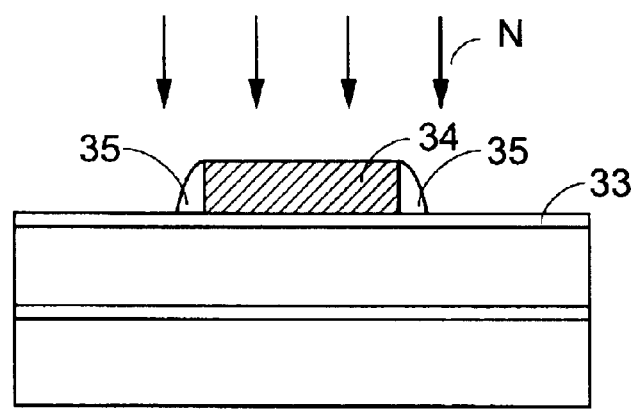
Figure 3D:
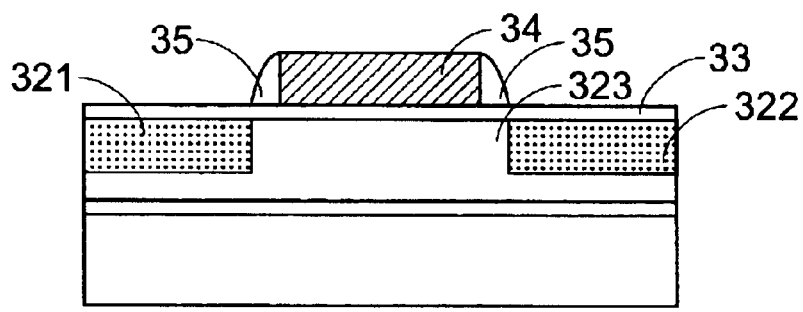
Figure 3E:
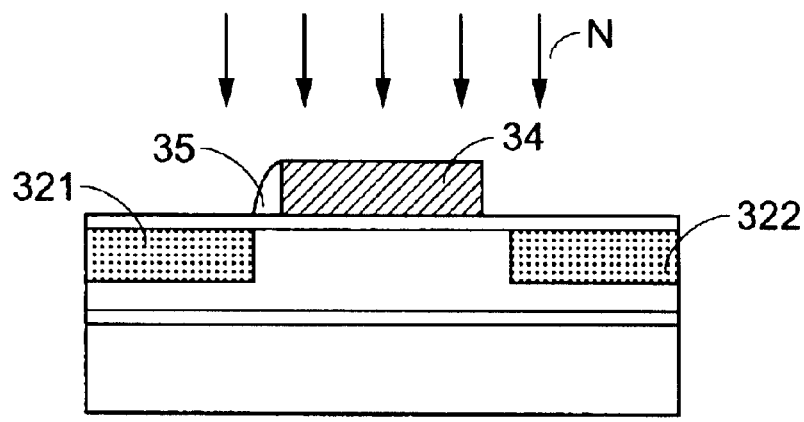
Figure 3F:
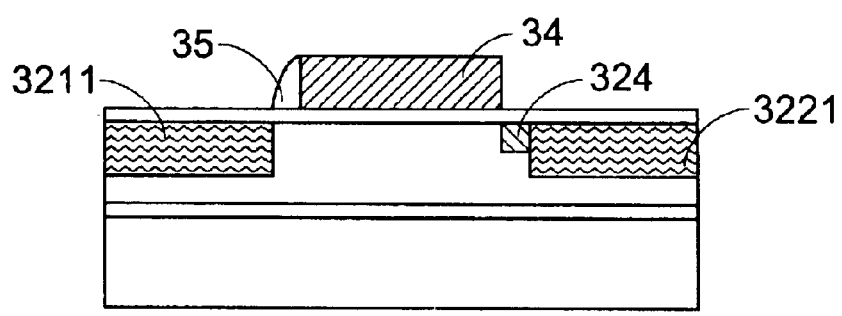

Another example of the process for producing a TFT having a single LDD structure according to the present invention will be described hereinafter. A buffer layer 31 is formed on a glass substrate 30. An intrinsic amorphous silicon (i-a-Si) layer is sequentially formed on the buffer layer 31, and the i-a-Si layer is further converted to an intrinsic polysilcon (i-poly-Si) layer 32 by a laser annealing procedure, as shown in FIG. 3(a). As shown in FIG. 3(b), a gate insulator 33 is formed on the polysilicon layer 32, and a gate structure 34 of a desired pattern is formed on the gate insulator 33. Further, as shown in FIGS. 3(c) and 3(d), a dielectric layer overlies the resulting structure of FIG. 3(b), and is patterned to form a spacer or sidewalls 35 beside the gate structure 34 via a micro-lithographic and etching process. The gate electrode 34 and its spacer/sidewalls 35 serve as a doping mask for a following N-type ion implantation procedure, thereby forming two N-type regions 321 and 322 in the polysilicon layer 32 exposed from the doping mask. The two N-type regions 321 and 322 are apart from each other by a channel region 323. Then, as shown in FIG. 3(e), a portion of the space 35 adacent to the N-type region 322 is removed such that an end portion of the channel region 223 is exposed. By a lightly ion implantation procedure with the gate electrode 26 and the remaining spacer 35 serving as a doing mask to provide trace N-type dopants into the exposed portion of the polysilicon layer 32, a single LDD structure 324 is formed in the polysilicon layer 32, as can be seen in FIG. 3(f), and the N-type-regions are simultaneously heavily doped to form source/drain structures 3211 and 3221. Afterwards, the following necessary steps, e.g. the similar subsequent steps as described in the above embodiment, are performed.

Since each of the above-mentioned TFTs has a single LDD structure, the distance between the depletion regions in the vicinity of the source/drain regions could be somewhat increased, compared to those with two LDD structures. Therefore, the hot electron, current leakage and punch-through effects occurred in the prior art are considerably diminished. The above processes are particularly suitable for a driver circuit and other application circuits.

As for pixel units, in order to comply with the operational modes of a TFT, the present invention provides additional P-type regions beside the LDD structures to solve the problems. Two examples of the processes for producing such TFTs are illustrated with reference to FIGS. 4(a) to 4(h) and 5(a) to 5(h), respectively.

Figure 4A:
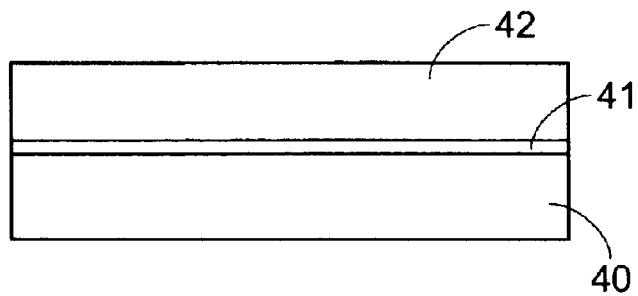
FIGS. 4(a) to 4(h) are schematic cross-sectional views illustrating a process for producing a TFT having a dual layer LDD structure according to the present invention.
Figure 4B:
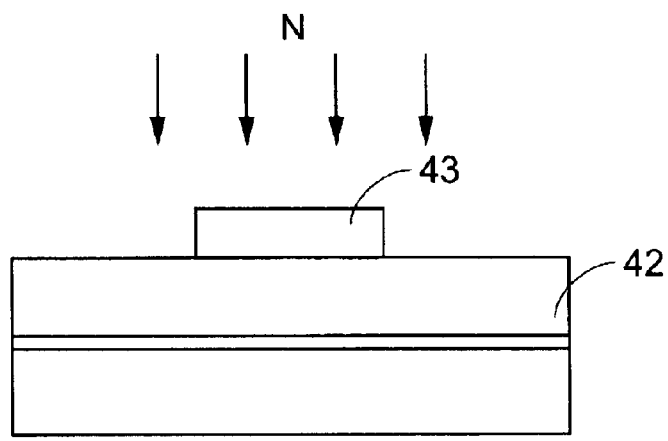
Figure 4C:
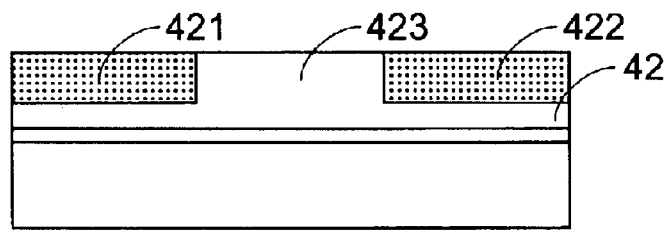
Figure 4D:
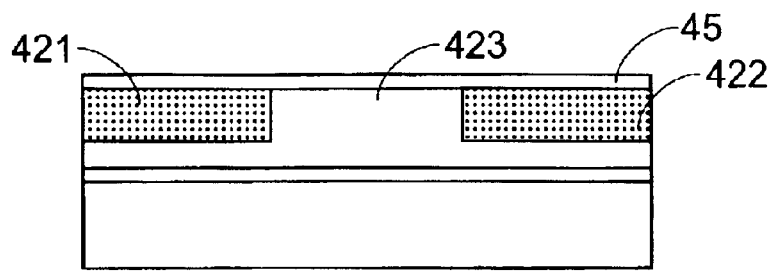
Figure 4E:
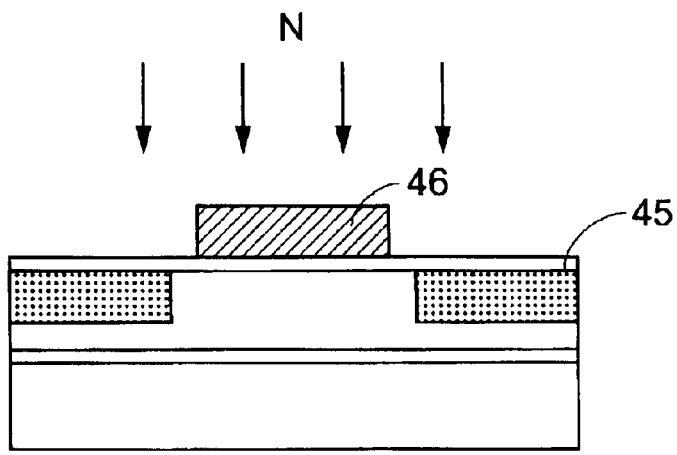
Figure 4F:
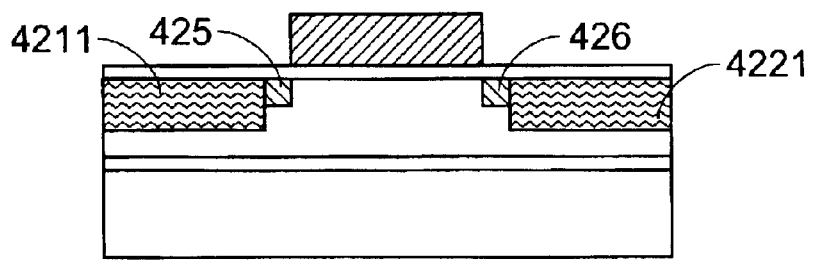
Figure 4G:
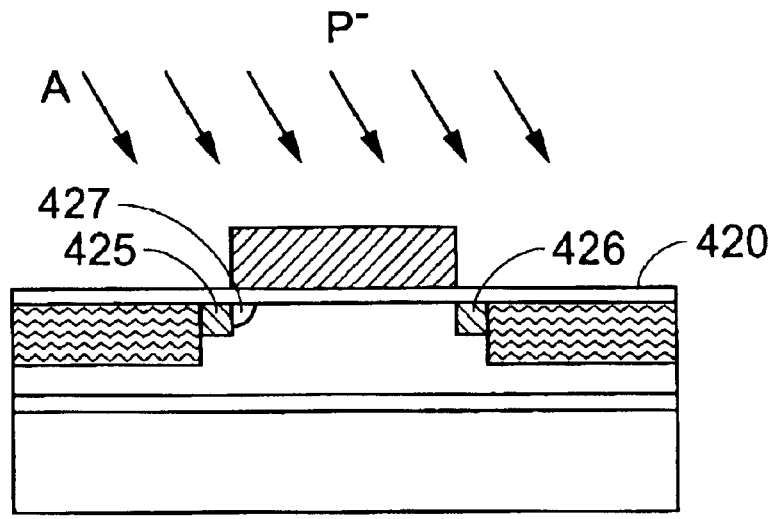
Figure 4H:
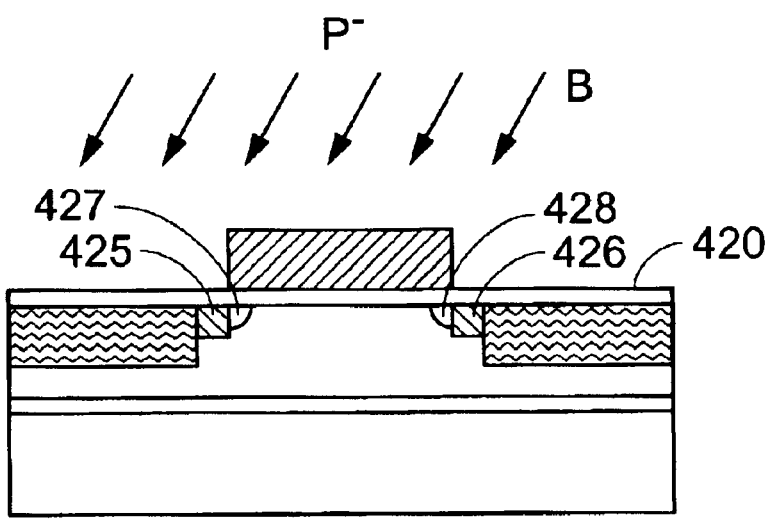

As shown in FIG. 4(a), a buffer layer 41 is formed on a glass substrate 40. An intrinsic amorphous silicon (i-a-Si) layer is sunsequently formed on the buffer layer 41, and the i-a-Si layer is further converted to an intrinsic polysilcon (i-poly-Si) layer 42 by a laser annealing procedure. A photoresist layer is formed on the polysilicon layer 42 and properly patterned to be a mask 43 via a micro-lithographic and etching process, and two N-type regions 421 and 422 are formed in the polysilicon layer 22 exposed from the mask 43 by an N-type ion implantation procedure, as shown in FIGS. 4(b) and 4(c). The two N-type regions 421 and 422 are apart from each other by a channel region 423. Then, the photoresist mask 43 is removed. Referring to FIG. 4(d), a gate insulator 45 for example made of silicon dioxide is formed on the resulting structure of FIG. 4(c). As shown in FIG. 4(e), a gate electrode 46 having a width slightly less than the length of the channel 423 is then formed on the gate insulator 45 via patterning and etching procedures such that two end portions of the channel region 423 are exposed and uncovered by the gate electrode 46. Then, by a lightly ion implantation procedure with the gate electrode 46 serving as a mask to provide trace N-type dopants into the exposed portion of the polysilicon layer 42, two LDD structures 425 and 426 are formed in the polysilicon layer 42, as can be seen in FIG. 4(f), and the N-type regions 421 and 422 are consequently heavily doped to form the source/drain regions 4211 and 4221. Further, two ion implantation procedures are performed with the gate electrode 46 as a mask to inject a P-type doping material into the polysilicon layer 42 in a first direction A and a second direction B deviating from the surface 420 of the polysilicon layer 42 by a first and a second angles, respectively. For example, each of the first angle and the second angle can be made equal and ranged between 0° and 30°. Therefore, P-type halo regions 427 and 428 are formed immediately next to the two LDD structures 425 and 426, respectively. Afterwards, the following necessary steps, e.g. the similar subsequent steps as described in the above embodiment, are performed. Due to the gradual distribution of dopant concentration resulting from slant implantation, the width of the depletion regions interfacing the channel region with the source/drain regions is reduced so as to minimize current leakage and punch through effects.

Figure 5A:
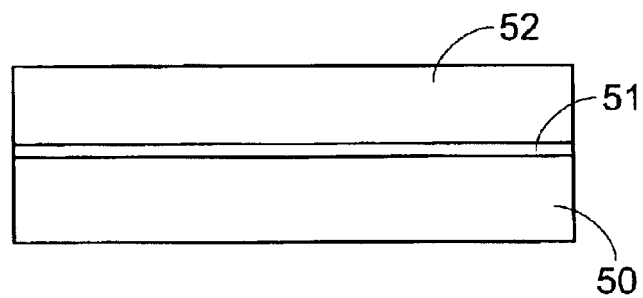
FIGS. 5(a) to 5(h) are schematic cross-sectional views illustrating another process for producing a TFT having another dual layer LDD structure according to the present invention.
Figure 5B:
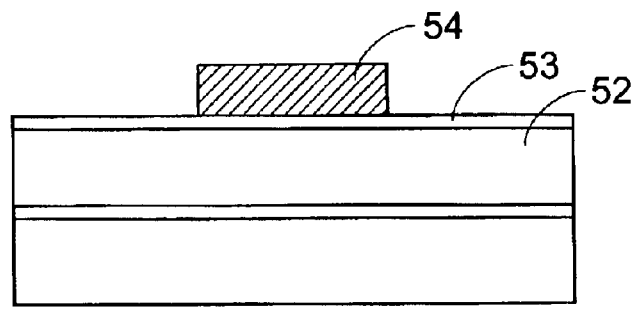
Figure 5C:
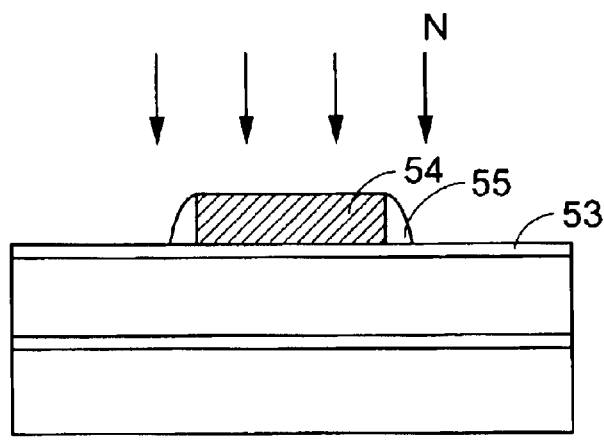
Figure 5D:
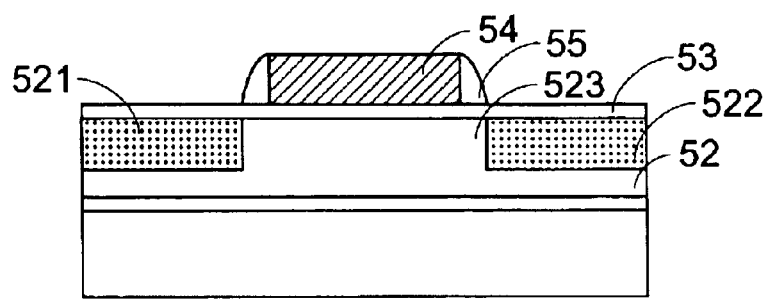
Figure 5E:
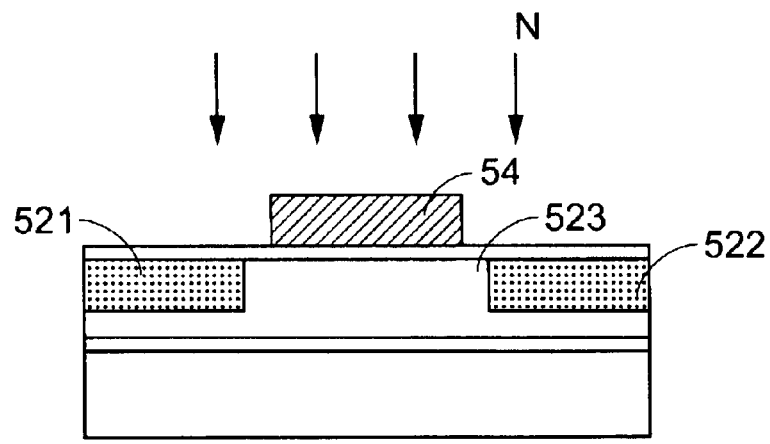
Figure 5F:
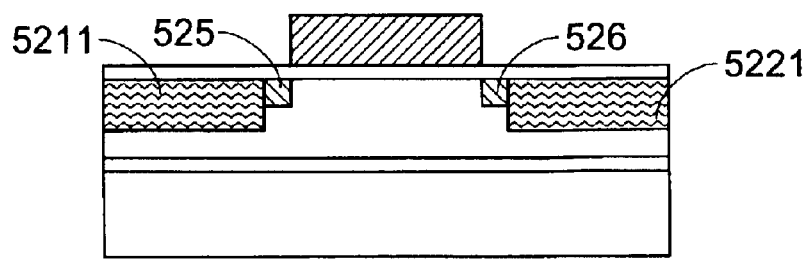
Figure 5G:
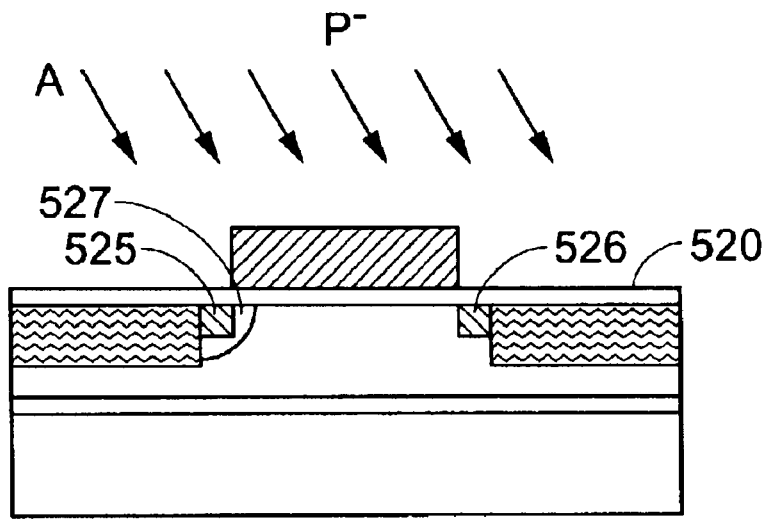
Figure 5H:
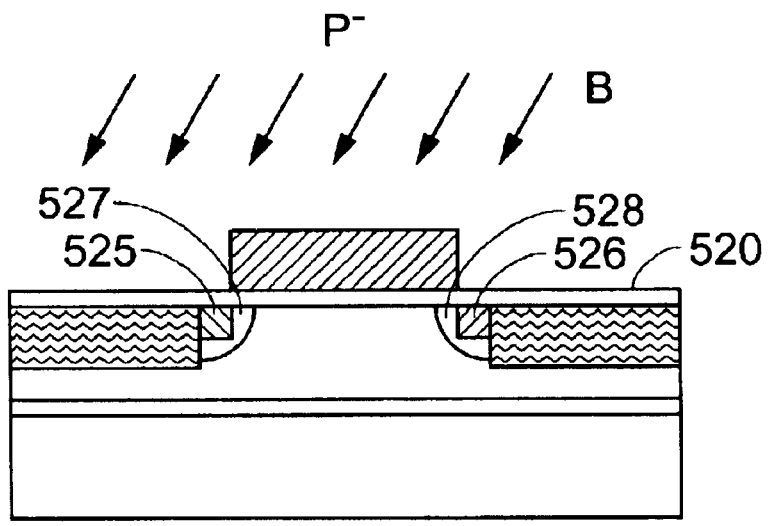

Another example of the process for producing a TFT having a LDD/halo structure according to the present invention will be described hereinafter. A buffer layer 51 is formed on a glass substrate 50. An intrinsic amorphous silicon (i-a-Si) layer is sequentially formed on the buffer layer 51, and the i-a-Si layer is further converted to an intrinsic polysilcon (i-poly-Si) layer 52 by a laser annealing procedure, as shown in FIG. 5(a). As shown in FIG. 5(b), a gate insulator 53 is formed on the polysilicon layer 52, and a gate structure 54 of a desired pattern is formed on the gate insulator 53. Further, as shown in FIGS. 5(c) and 5(d), a dielectric layer overlies the resulting structure of FIG. 5(b), and is patterned to form a spacer or sidewalls 55 beside the gate structure 54 via a micro-lithographic and etching process. The gate electrode 54 and its spacer/sidewalls 55 serves as a doping mask for a following N-type ion implantation procedure, thereby forming two N-type regions 521 and 522 in the polysilicon layer 52 exposed from the doping mask. The two N-type regions 521 and 522 are apart from each other by a channel region 523. Then, as shown in FIG. 5(e), the spacer/sidewalls 55 are fully removed such that two end portions of the channel region 523 are exposed. By a lightly ion implantation procedure with the gate electrode 56 serving as a doing mask to provide trace N-type dopants into the exposed portion of the polysilicon layer 52, as can be seen in FIG. 3(f), and two LDD structures 525 and 526 are formed in the polysilicon layer 42. Further, two ion implantation procedures are performed with the gate electrode 56 as a mask to inject a P-type doping material into the polysilicon layer 52 in a first direction A and a second direction B deviating from the surface 520 of the polysilicon layer 42 by a first and a second angles, respectively. For example, each of the first angle and the second angle can be made equal and ranged between 0° and 30°. Therefore, P-type halo regions 527 and 528 are formed immediately next to the two LDD structures 525 and 526, respectively. In this embodiment, the P-type halo regions 527 and 528 surround the entire LDD structures 525 and 526, respectively. Afterwards, the similar subsequent steps as mentioned above are performed to form a dielectric layer and gate and source/drain conductive lines.

The ion implantation procedures mentioned above, for example, can also be substituted by ion shower procedures. In the above embodiments, the gate conductor is formed by sputtering with chromium, tungsten molybdenum, tantalum, aluminum or copper and has a thickness of about 100 nm.

The buffer layer generally has a thickness of about 600 nm and is formed of silicon nitride, silicon oxide or a combination thereof by a plasma enhanced chemical vapor deposition (PECVD) procedure. The interlayer dielectric layer generally has a thickness of about 600 nm and is formed of silicon dioxide by a plasma enhanced chemical vapor deposition (PECVD) procedure. The gate insulator used generally has a thickness of about 100 nm and is formed of silicon dioxide by a plasma enhanced chemical vapor deposition (PECVD) procedure. An amorphous silicon layer having a thickness of about 100 nm is employed to form the polysilicon layer in the above embodiments by a laser annealing/crystallizing procedure. Preferably, the amorphous silicon layer needs to be dehydrogenated for 30 min in a high temperature furnace at 400° C. prior to the laser annealing/crystallizing procedure. During the laser annealing/crystallizing procedure, the energy for carrying out the laser annealing/crystallizing procedure is selected such that at least 100 shots are provided at 350 mJ/cm². In addition, the dopant concentration in the above-described ion implantation procedure ranges from $1\times10^{14}$ to $2\times10^{15}$ cm$^{-2}$ for the N-type dopants, and about $1\times10^{12}$ for the P-type dopants. The P-type dopant can be selected from B ions, BH$_x$ ions, B$_2$H$_x$ ions or a combination thereof, and the N-type dopant can be selected from P ions, As ions, PH$_x$ ions, AsH$_x$ ions and a combination thereof. The contact holes are formed by a reactive ion etching procedure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A low temperature polysilicon thin film transistor (LTPS-TFT), comprising:
    a semiconductor layer formed of polycrystalline silicon;
    source/drain structures formed apart from each other in said semiconductor layer;
    a first LDD structure disposed between said source/drain structures, and having a first side adjacent to a first one of said source/drain structures and a second side opposed to said first side;
    a first halo structure having a third side adjacent to said second side of said first LDD structure, and a fourth side spaced from a second one of said source/drain structures by said semiconductor material;
    a second LDD structure disposed between said source/drain structures, and having a fifth side adjacent to said second one of said source/drain structures and a sixth side opposed to said fifth side;
    a second halo structure having a seventh side adjacent to said sixth side of said second LDD structure, and an eighth side spaced from said fourth side of said first halo structure by said semiconductor material;
    a gate electrode formed over said semiconductor layer; and
    an insulator layer disposed between said semiconductor layer and said gate electrode for insulating said gate electrode from said source/drain structures and said LDD and said halo structures,
    wherein at least a portion of said first and second LDD structures is exposed from said first and second halo structures and said source/drain structures.

2. The low temperature polysilicon thin film transistor according to claim 1 wherein said first LDD structure is a gate-drain overlapped LDD.

3. The low temperature polysilicon thin film transistor according to claim 1 wherein said thin film transistor is of an N-type, said first LDD structure contains a doping material selected from a group consisting of P ions, As ions, PH$_x$ ions, AsH$_x$ ions and a combination thereof, and said first halo structure contains doping material selected from a group consisting of B ions, BH$_x$ ion, B$_2$H$_x$ ions and a combination thereof.

4. The low temperature polysilicon thin film transistor according to claim 1 wherein said second LDD structure contains a doping material selected from a group consisting of P ions, As ions, PH$_x$ ions, AsH$_x$ ions and a combination thereof, and said second halo structure contains doping material selected from a group consisting of B ions, BH$_x$ ion, B$_2$H$_x$ ions and a combination thereof.

5. A low temperature polysilicon thin film transistor (LTPS-TFT), comprising:
    a semiconductor layer formed of polycrystalline silicon;
    source/drain structures formed apart from each other in said semiconductor layer;
    a first LDD structure disposed between said source/drain structures, and having a first side adjacent to a first one of said source/drain structures and a second side opposed to said first side;
    a first halo structure having a third side adjacent to said second side of said first LDD structure, and a fourth side spaced from a second one of said source/drain structures by said semiconductor material;
    a second LDD structure disposed between said source/drain structures, and having a fifth side adjacent to said second one of said source/drain structures and a sixth side opposed to said fifth side;
    a second halo structure having a seventh side adjacent to said sixth side of said second LDD structure, and an eighth side spaced from said fourth side of said first halo structure by said semiconductor material;
    a gate electrode formed over said semiconductor layer; and
    an insulator layer disposed between said semiconductor layer and said gate electrode for insulating said gate electrode from said source/drain structures and said LDD and said halo structures,
    wherein said first LDD structure is enclosed with said first halo structure and said first one of said source/drain structures, and said second LDD structure is enclosed with said second halo structure and said second one of said source/drain structures.

* * * * *